US009602325B2

(12) United States Patent
Hezar et al.

(10) Patent No.: US 9,602,325 B2
(45) Date of Patent: *Mar. 21, 2017

(54) TRANSMITTER AND METHOD OF TRANSMITTING

(71) Applicant: TEXAS INSTRUMENTS INCORPORATED, Dallas, TX (US)

(72) Inventors: Rahmi Hezar, Allen, TX (US); Lei Ding, Plano, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/063,146

(22) Filed: Mar. 7, 2016

(65) Prior Publication Data

US 2016/0191294 A1 Jun. 30, 2016

Related U.S. Application Data

(63) Continuation of application No. 14/172,714, filed on Feb. 4, 2014, now Pat. No. 9,281,976.

(51) Int. Cl.
*H04L 5/00* (2006.01)
*H04L 27/34* (2006.01)
(Continued)

(52) U.S. Cl.
CPC ............ *H04L 27/3411* (2013.01); *H03F 1/02* (2013.01); *H03F 1/0294* (2013.01); *H03F 3/19* (2013.01); *H03F 3/245* (2013.01); *H04B 1/02* (2013.01); *H04B 14/062* (2013.01); *H04L 27/2053* (2013.01); *H03F 2200/331* (2013.01); *H03F 2200/451* (2013.01)

(58) Field of Classification Search
CPC .......... H03C 1/00; H04B 14/006; H04B 1/00; H04B 3/00; H04B 5/00; H04B 7/00; H04B 10/00; H04B 13/00; H04B 1/02; H04B 14/062; H03F 1/3241; H04L 27/34; H04L 5/00; H04L 15/00; H04L 17/00; H04L 27/3411; H04L 27/04; H04L 27/36
USPC .................................................. 375/295–297
See application file for complete search history.

(56) References Cited

U.S. PATENT DOCUMENTS 5,490,172 A 2/1996 Komara
6,708,004 B1 3/2004 Homsey
(Continued)

FOREIGN PATENT DOCUMENTS

WO WO0018004 A1 3/2000

OTHER PUBLICATIONS

International Search Report and Written Opinion for PCT/US2014/058281 mailed Mar. 19, 2015.

*Primary Examiner* — Emmanuel Bayard
(74) *Attorney, Agent, or Firm* — Michael A. Davis, Jr.; Charles A. Brill; Frank D. Cimino

(57) ABSTRACT

At least one tone is generated. An output signal is generated in response to an input signal and the at least one tone. The output signal is modulated. The input signal and the at least one tone are represented in the modulated output signal. The at least one tone is outside a bandwidth of the input signal as represented in the modulated output signal. The modulated output signal is amplified. The at least one tone in the amplified signal is attenuated after the amplifying.

21 Claims, 3 Drawing Sheets

(51) Int. Cl.
*H04L 27/20* (2006.01)
*H03F 3/19* (2006.01)
*H03F 3/24* (2006.01)
*H03F 1/02* (2006.01)
*H04B 14/06* (2006.01)
*H04B 1/02* (2006.01)

(56) References Cited

U.S. PATENT DOCUMENTS

| | | | |
|---|---|---|---|
| 8,781,026 B2* | 7/2014 | Muhammad | H03C 1/00 |
| | | | 332/103 |
| 9,071,496 B2* | 6/2015 | Ghannouchi | H04L 27/36 |
| 9,118,341 B2* | 8/2015 | Matsumoto | H03M 3/332 |
| 9,281,976 B2* | 3/2016 | Hezar | H04B 14/062 |
| 2002/0168019 A1* | 11/2002 | Bengtsson | H04L 25/03859 |
| | | | 375/295 |
| 2003/0123566 A1* | 7/2003 | Hasson | H04L 27/2057 |
| | | | 375/279 |
| 2003/0179043 A1 | 9/2003 | Matz | |
| 2004/0223553 A1* | 11/2004 | Kumar | H04L 1/0059 |
| | | | 375/259 |
| 2009/0225897 A1 | 9/2009 | Toyota et al. | |
| 2010/0018383 A1 | 1/2010 | Thirumoorthy | |
| 2010/0183093 A1 | 7/2010 | Ghannouchi et al. | |
| 2011/0051923 A1* | 3/2011 | Aravind Batni | H04M 1/58 |
| | | | 379/391 |
| 2012/0064839 A1 | 3/2012 | Yang et al. | |
| 2012/0147931 A1 | 6/2012 | Takei | |
| 2013/0135912 A1 | 5/2013 | Nam et al. | |

\* cited by examiner

TRANSMITTER AND METHOD OF TRANSMITTING

This application is a continuation of U.S. application Ser. No. 14/172,714 filed Feb. 4, 2014, the content of which is incorporated by reference herein in its entirety.

BACKGROUND

Some radio frequency (RF) transmitters operate inefficiently with high peak to average ratios (PAR). With high PAR, the RF output is relatively low most of the time, but occasionally jumps to peak levels. A typical RF power amplifier operates most efficiently at high power or low PAR. As the power level is reduced, the efficiency decreases exponentially, and the average efficiency is less than optimal with high PAR.

SUMMARY

At least one tone is generated. An output signal is generated in response to an input signal and the at least one tone. The output signal is modulated. The input signal and the at least one tone are represented in the modulated output signal. The at least one tone is outside a bandwidth of the input signal as represented in the modulated output signal. The modulated output signal is amplified. The at least one tone in the amplified signal is attenuated after the amplifying.

DETAILED DESCRIPTION

Transmitters and methods of transmitting are disclosed herein. The transmitters and methods disclosed herein introduce tones (e.g., sidebands) outside a modulated bandwidth of an input signal, in order to reduce the PAR of power amplifiers. In some embodiments, the tones are filtered out prior to transmission. By introducing the tones, the ratio of the average power transmitted to the average power consumed increases, which increases efficiency of the transmitter.

Figure 1:
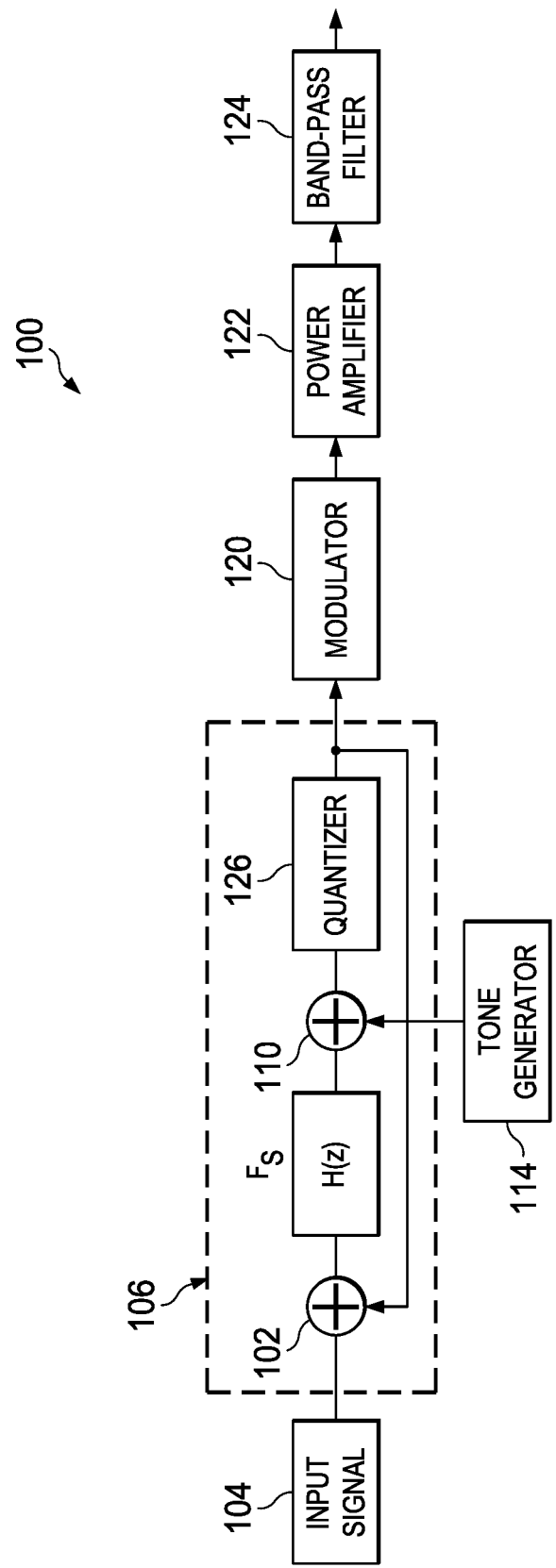
FIG. 1 is a block diagram of an embodiment of a transmitter.

FIG. 1 is a block diagram of an embodiment of a transmitter 100. The transmitter 100 includes an adder 102, which receives an input (e.g., baseband) signal 104. The adder 102 is part of a sigma-delta modulator ("SDM") 106. The SDM 106 operates at a sampling frequency Fs. Also, the SDM 106 includes an adder 110, which is coupled to a tone generator 114. In a first embodiment, the SDM 106 and the tone generator 114 are distinct from one another. In a second embodiment, the SDM 106 and the tone generator 114 are integral with one another. The SDM 106 generates its output signal in response to the input signal 104, and the tone generator 114 generates at least one tone.

The SDM 106 is coupled (e.g., connected) to a transmission modulator 120 (e.g., RF modulator), which modulates (or otherwise converts) the output signal from the SDM 106 into a signal for transmission. In some embodiments, the modulator 120 generates a carrier for performing such modulation at a frequency Fc, which is higher than the frequency Fs.

The modulated output signal from the modulator 120 is received by a power amplifier 122. An example of the amplifier 122 includes a switching power amplifier, such as class D and class E amplifiers. Another example of the amplifier 122 includes a linear amplifier, such as class A, class B, and class AB amplifiers. The amplifier 122 amplifies the modulated output signal from the modulator 120, including the tones from the tone generator 114. The amplified signal is output from the amplifier 122 to a filter 124. In some embodiments, the filter 124 is incorporated into a conventional antenna. The filter 124 attenuates the tones (in the amplified signal) from the tone generator 114.

In a first example, the input signal 104 is an audio signal. In a second example, the input signal 104 is a component of a complex signal. In one example, the input signal 104 is the I component of a quadrature signal. The SDM 106 includes a loop filter H(z), which receives and filters an output signal from the adder 102. An output signal from the filter H(z) is received by the adder 110, which adds such output signal to the tones from the tone generator 114. An output signal from the adder 110 is received and quantized by a quantizer 126. The adder 102 receives the quantized output signal from the quantizer 126 (which is the output signal from the SDM 106), and subtracts such quantized output signal from the input signal 104. In one embodiment, even though respective signals from the adder 102, the filter H(z), the adder 110, and the quantizer 126 are mentioned as different signals, the SDM 106 adds the tones and generates its output signal in one step.

Figure 2:
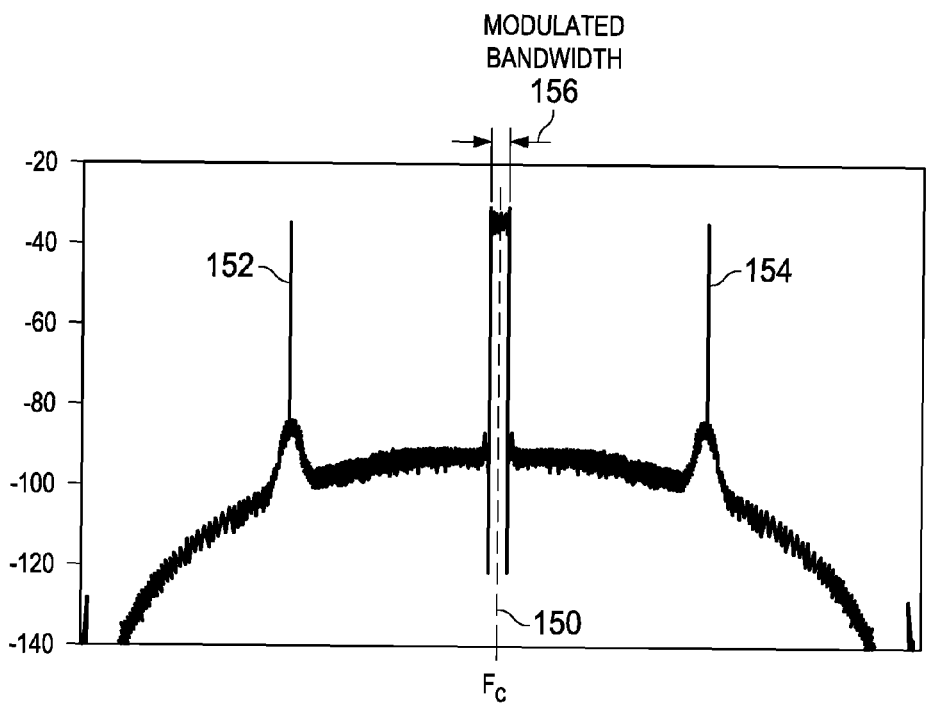
FIG. 2 is an example graph of an output signal from a modulator of FIG. 1.

FIG. 2 is an example graph of the modulated output signal from the modulator 120. As shown in FIG. 2, the modulator 120 generates a carrier 150 for modulating at the frequency Fc. The input signal 104 and the tones from the tone generator 114 are represented in the modulated output signal from the modulator 120. For example, as represented in the modulated output signal of FIG. 2, frequencies of first and second tones 152 and 154 (e.g., from the tone generator 114) are: (a) outside a bandwidth 156 ("modulated bandwidth") of the input signal 104; and (b) within a frequency range of the amplifier 122, so those tones are amplified by the amplifier 122. For example, the first tone 152 is located at a frequency that is below the frequency Fc, and the second tone 154 is located at a frequency that is above the frequency Fc. In some embodiments, the tones 152 and 154 are substantially symmetric around the frequency Fc, so they are approximately the same distance from the frequency Fc.

In the embodiments described herein, the modulator 120 performs either LINC modulation or AMO operations to modulate the output signal from the SDM 106. Accordingly, examples of the modulator 120 include a LINC/AMO (linear modulation using non-linear components/asymmetrical multi-level out-phasing) out-phasing digital modulator and an RF upconverter. In other embodiments, the modulator 120 includes conventional quadrature modulators.

After the modulator 120 modulates the output signal from the SDM 106 at the carrier frequency Fc, the modulated output signal from the modulator 120 is amplified by the amplifier 122. The transmitter 100 keeps the tones 152 and 154 within the frequency range of the amplifier 122, so that: (a) the average operating power of the amplifier 122 is greater than it would otherwise be without the tones 152 and 154; and (b) the peak to average ratio (PAR) is lower. In that manner, the amplifier 122 operates at a higher average power, so it operates more efficiently.

In the embodiment of FIG. 1, the filter 124 is a band-pass filter that passes signals within the modulated bandwidth and attenuates the tones 152 and 154. In some embodiments, the filter 124 is incorporated into the load of an antenna and includes load components, such as resistors and inductors, for matching the antenna's impedance to other circuits. In those embodiments, the loading of the antenna additionally attenuates the tones 152 and 154. The result is that the amplifier 122 operates at a higher efficiency by amplifying the tones 152 and 154, but the tones 152 and 154 are attenuated so that they are not transmitted.

In a first embodiment, the tone generator 114 generates a square wave, which produces single tones 152 and 154. In a second embodiment, the tone generator 114 generates other waveforms, such as a triangular wave or a sine wave. In some embodiments, waveforms of the tones from the tone generator 114 are periodic and produce dithering. Such various waveforms are capable of generating different tones or harmonics, suitable to accommodate a variety of design choices.

In some embodiments, the tone generator 114 generate the tones in response to the input signal 104. In those embodiments, the input signal 104 is mixed to the sideband frequencies for addition by the adder 110. In one example, those tones have wider bandwidths than tones that would have otherwise been generated by the tone generator 114. In one version of such embodiments, the filter 124 is a narrow band-pass filter that attenuates the tones (in the amplified signal) from the tone generator 114. In some embodiments, the transmitter 100 includes additional filters for performing such attenuation.

Figure 3:
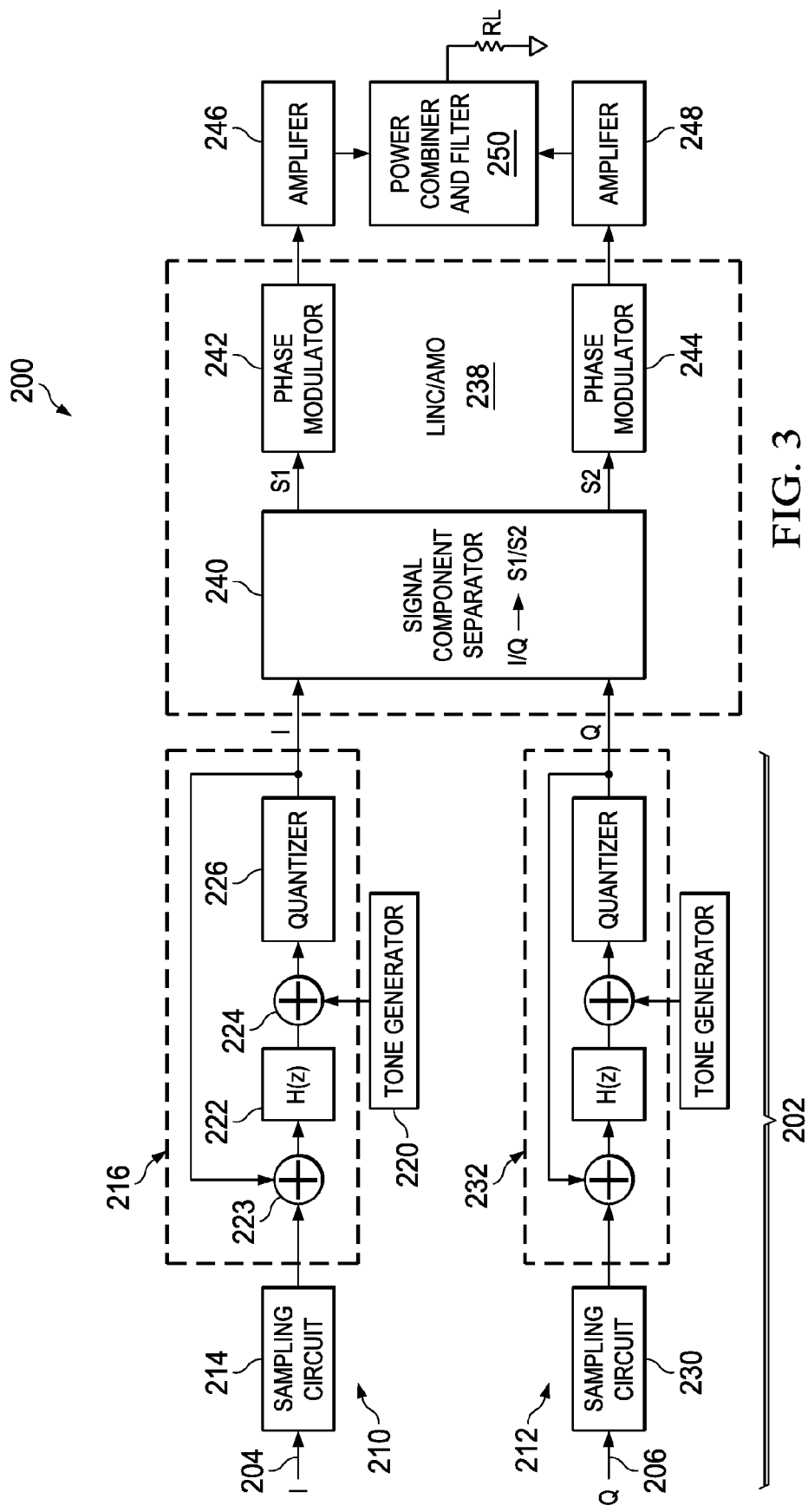
FIG. 3 is a block diagram of another embodiment of a transmitter.

FIG. 3 is a block diagram of another embodiment of a transmitter 200. The transmitter 200 operates in a similar manner as the transmitter 100, except that the transmitter 200 processes two components of a complex signal, such as I and Q components. The transmitter 200 has an input stage 202, which receives a complex signal. In this example, the input stage 202 receives: (a) a first signal 204 that represents the I component of the complex signal; and (b) a second signal 206 that represents the Q component of the complex signal. The first signal 204 is received by a first portion ("I processor") 210 of the transmitter 200, which processes the I component of the complex signal. The second signal 206 is received by a second portion ("Q processor") 212 of the transmitter 200, which processes the Q component of the complex signal.

With reference to the I processor 210, the first signal 204 is received by a sampling circuit 214, which samples the first signal 204. In some embodiments, the sampling circuit 214 generates and outputs a pulse coded or quantized signal that is representative of the I component.

The output signal from the sampling circuit 214 is received by an SDM 216. In some embodiments, the SDM 216 is referred to as an oversampling modulator that has a sampling rate greater than a Nyquist sampling rate. In some embodiments, the sampling rate is many factors greater than the Nyquist sampling rate. Accordingly, high frequency nonlinearities are typically outside the modulated bandwidth. A tone generator 220 generates the tones described hereinabove. The SDM 216 includes a loop filter 222, which receives and filters an output signal from an adder 223. An output signal from the filter 222 is received by an adder 224, which adds such output signal to the tones from the tone generator 220. An output signal from the adder 224 is received and quantized by a quantizer 226. The adder 223 receives the quantized output signal from the quantizer 226 (which is the output signal from the SDM 216), and subtracts such quantized output signal from the signal that the SDM 216 receives from the circuit 214.

The Q processor 212 has the same types of components and performs the same types of operations as the I processor 210, except that the Q processor 212 operates in response to the second signal 206 (instead of the first signal 204). Accordingly, the Q processor 212 includes a sampling circuit 230 and an SDM 232. In the embodiment of FIG. 3, the output signal from the SDM 216 is the sampled, filtered and quantized I component of the first signal 204 with added tones from the tone generator 220 ("I signal"). Likewise, the output signal from the SDM 232 is the sampled, filtered and quantized Q component of the second signal 206 with added tones from a tone generator that is coupled to the SDM 232 ("Q signal"). In one embodiment, the SDM 232 is substantially identical to the SDM 216, and the tone generators are substantially identical to one another.

The I and Q signals are received by a transmission modulator 238. In some embodiments, the modulator 238 is substantially similar to the modulator 120 of FIG. 1. Accordingly, examples of the modulator 238 include LINC (linear using non-linear components) and AMO (asymmetrical multi-level out-phasing) modulators.

The modulator 238 includes a signal component separator 240 that is coupled to the SDMs 216 and 232. In the embodiment of FIG. 3, the separator 240 converts the I and Q signals (from the SDMs 216 and 232 respectively) into two phase signals (namely S1 and S2) representing S1 and S2 phases of the I and Q signals. Accordingly, the separator 240 generates: the S1 phase signal as a voltage representative of the S1 phase; and the S2 phase signal as a voltage representative of the S2 phase.

The S1 phase signal is received and modulated by a first phase modulator 242. Similarly, the S2 phase signal is received and modulated by a second phase modulator 244. Accordingly, the phase modulators 242 and 244 generate and output those phase modulated signals, which include the tones. In the illustrative embodiments, the signals output by the SDMs 216 and 232 are quantized, so the S1 and S2 phase signals are quantized to a predetermined number of phases.

The modulated output signal from the first phase modulator 242 is received by a first amplifier 246, and the modulated output signal from the second phase modulator 244 is received by a second amplifier 248. In some embodiments, the amplifiers 246 and 248 are power amplifiers and amplify those signals to a power level for radio frequency (RF) transmission. As represented in the modulated output signals from the modulator 238, frequencies of the tones from the tone generators (e.g., from the tone generator 220) are: (a) outside modulated bandwidths of the signals 204 and 206; and (b) within frequency ranges of the amplifiers 246 and 248. Accordingly, the average operating power of the amplifiers 246 and 248 is greater than it would otherwise be without the tones being amplified, so the peak to average ratio (PAR) is lower. For example, the ratio of the average power transmitted to the average power consumed increases. In that manner, the amplifiers 246 and 248 operate at a higher average power, so they operate more efficiently.

The amplified signals from the amplifiers 246 and 248 are received by a power combiner 250, which combines those amplified signals. In some embodiments, the power combiner 250 includes a filter, such as a band-pass filter to attenuate the tones so they are not transmitted. The power combiner 250 outputs the combined signal to an antenna (not shown) that is matched with a load $R_L$. The load $R_L$ provides impedance matching for the antenna or other transmitting device. In some embodiments, the load $R_L$ (along with other impedance matching device) provides additional filtering.

Figure 4:
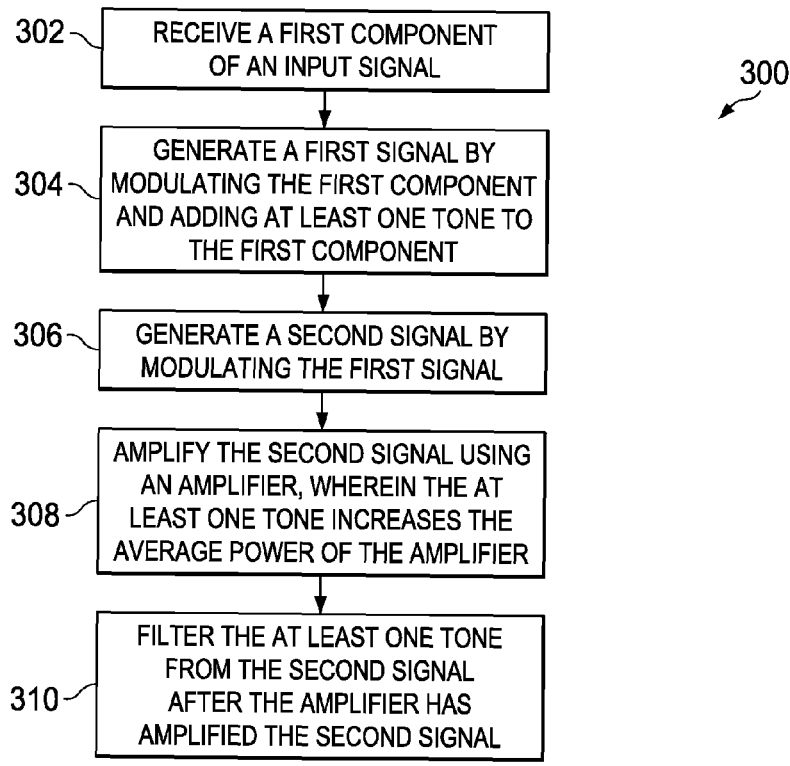
FIG. 4 is a flow chart of operation of a processor of FIG. 3.

FIG. 4 is a flow chart 300 of operation of the I processor 210, which is a representative one of the processors 210 and 212. At a step 302, a first component of an input signal is received. At a step 304, a first signal is generated by modulating the first component and adding at least one tone thereto. At a step 306, a second signal is generated by modulating the first signal. At a step 308, the second signal is amplified by an amplifier, wherein the at least one tone increases the average power of the amplifier. At a step 310, the at least one tone is filtered from the amplified second signal after the amplifying.

With reference to FIGS. 1 and 2, the energy wasted on the tones 152 and 154 at the power amplifier 122 has been found to be negligible compared to the energy saved on transmitting the carrier 150 at the power amplifier. In some embodiments, less than 1% of the total transmitted power is wasted on the tones 152 and 154. However the tones 152 and 154 reshape the overall signal distribution such that the power amplifier 122 mostly operates at larger amplitude values, which correspond to a more efficient operating point. In some embodiments, the average efficiency of the power amplifier 122 is increased from 10% to 50% by adding the tones 152 and 154. For example, if the power saved is equal to 0.9 times the average power minus 0.5 times the average power, the power saved is equal to 0.4 times the average power. If the extra power used to generate the tones 152 and 154 is equal to one percent of the average power, the extra power is equal to 0.01 times the average power. Therefore, the total power saved is equal to 0.39 times the average power.

Although illustrative embodiments have been shown and described by way of example, a wide range of alternative embodiments is possible within the scope of the foregoing disclosure.

What is claimed is:

1. A transmitter, comprising:
a tone generator for generating at least one tone;
a sigma-delta modulator for generating an output signal in response to an input signal and the at least one tone;
a transmission modulator for modulating the output signal, wherein: the input signal and the at least one tone are represented in the modulated output signal, and the at least one tone is outside a bandwidth of the input signal as represented in the modulated output signal;
an amplifier for amplifying the modulated output signal; and
a filter coupled to the amplifier for attenuating the at least one tone in the amplified signal after the amplifying.

2. The transmitter of claim 1, wherein generating the output signal includes sigma-delta modulation of the input signal.

3. The transmitter of claim 1, wherein the transmission modulator includes a phase modulator for modulating the output signal.

4. The transmitter of claim 1, wherein the sigma-delta modulator is for receiving the input signal at a first frequency, and wherein the transmission modulator is for modulating the output signal at a second frequency higher than the first frequency.

5. The transmitter of claim 1, wherein the at least one tone includes: a low tone below the bandwidth; and a high tone above the bandwidth.

6. The transmitter of claim 5, wherein the modulated tones are within a frequency range of the amplifier.

7. The transmitter of claim 1, wherein the at least one tone is for increasing an average operating power of the amplifier.

8. A method, comprising:
generating at least one tone;
generating an output signal in response to an input signal and the at least one tone;
modulating the output signal, wherein: the input signal and the at least one tone are represented in the modulated output signal, and the at least one tone is outside a bandwidth of the input signal as represented in the modulated output signal;
amplifying the modulated output signal; and
attenuating the at least one tone in the amplified signal after the amplifying.

9. The method of claim 8, wherein generating the output signal includes sigma-delta modulation of the input signal.

10. The method of claim 8, wherein modulating the output signal includes modulating the output signal with a phase modulator.

11. The method of claim 8, wherein generating the output signal includes receiving the input signal at a first frequency, and wherein modulating the output signal includes modulating the output signal at a second frequency higher than the first frequency.

12. The method of claim 8, wherein the at least one tone includes: a low tone below the bandwidth; and a high tone above the bandwidth.

13. The method of claim 12, wherein amplifying the modulated output signal includes amplifying the modulated output signal with an amplifier, and wherein the modulated tones are within a frequency range of the amplifier.

14. The method of claim 8, wherein amplifying the modulated output signal includes amplifying the modulated output signal with an amplifier, and wherein the at least one tone is for increasing an average operating power of the amplifier.

15. A transmitter, comprising:
a tone generator for generating: at least one first tone; and at least one second tone;
a first sigma-delta modulator for generating a first output signal in response to a first component of a complex signal and the at least one first tone;
a second sigma-delta modulator for generating a second output signal in response to a second component of the complex signal and the at least one second tone;
a phase modulator for modulating the first and second output signals, wherein: the first component and the at least one first tone are represented in the modulated first output signal, and the at least one first tone is outside a bandwidth of the first component as represented in the modulated first output signal; and the second component and the at least one second tone are represented in the modulated second output signal, and the at least one second tone is outside a bandwidth of the second component as represented in the modulated second output signal;
an amplifier for amplifying the modulated first and second output signals; and
a filter coupled to the amplifier for attenuating the tones in the amplified signals after the amplifying.

16. The transmitter of claim 15, wherein the first and second sigma-delta modulators are for receiving the first and second components at a first frequency, and the phase modulator is for modulating the first and second output signals at a second frequency higher than the first frequency.

17. The transmitter of claim 15, wherein the at least one first tone includes: a low tone below the bandwidth of the first component; and a high tone above the bandwidth of the first component.

18. The transmitter of claim 15, wherein the modulated tones are within a frequency range of the amplifier.

19. The transmitter of claim 15, wherein the tones are for increasing an average operating power of the amplifier.

20. The transmitter of claim 15, wherein the tone generator includes: a first tone generator for generating the at least one first tone; and a second tone generator for generating the at least one second tone.

21. The transmitter of claim 15, wherein the amplifier includes: a first amplifier for amplifying the modulated first output signal; and a second amplifier for amplifying the modulated second output signal.

* * * * *